United States Patent
Barwicz et al.

(10) Patent No.: US 8,080,456 B2
(45) Date of Patent: Dec. 20, 2011

(54) ROBUST TOP-DOWN SILICON NANOWIRE STRUCTURE USING A CONFORMAL NITRIDE

(75) Inventors: Tymon Barwicz, Yorktown Heights, NY (US); Lidija Sekaric, Mount Kisco, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 12/469,304

(22) Filed: May 20, 2009

(65) Prior Publication Data

US 2010/0295020 A1   Nov. 25, 2010

(51) Int. Cl.
*H01L 21/336* (2006.01)

(52) U.S. Cl. ........ 438/257; 438/149; 438/154; 438/199; 438/243; 438/283; 438/610; 438/622; 438/666; 257/315; 257/327; 257/344; 257/349; 257/E21.415

(58) Field of Classification Search .................. None
See application file for complete search history.

(56) References Cited

U.S. PATENT DOCUMENTS

| | | | | |
|---|---|---|---|---|
| 6,046,408 | A | 4/2000 | Forrest | 174/106 |
| 6,175,659 | B1 | 1/2001 | Huang | 382/266 |
| 7,217,978 | B2 | 5/2007 | Joshi et al. | 257/351 |
| 7,274,072 | B2 | 9/2007 | Chang et al. | 257/368 |
| 7,601,570 | B2 * | 10/2009 | Damlencourt | 438/149 |
| 2005/0285149 | A1 | 12/2005 | Chang | 257/210 |
| 2006/0281321 | A1 | 12/2006 | Conley et al. | 438/703 |
| 2007/0187731 | A1 | 8/2007 | Chang | 257/288 |
| 2007/0242507 | A1 | 10/2007 | Bernstein et al. | 365/176 |
| 2007/0281156 | A1 | 12/2007 | Lieber et al. | 428/373 |
| 2008/0008844 | A1 | 1/2008 | Bettge et al. | 427/576 |
| 2008/0014689 | A1 | 1/2008 | Cleavelin et al. | 438/197 |
| 2008/0041814 | A1 | 2/2008 | Romano et al. | 216/13 |

FOREIGN PATENT DOCUMENTS

| | | |
|---|---|---|
| WO | WO-2008/018834 A1 | 2/2008 |
| WO | WO-2009/072984 A1 | 6/2009 |

OTHER PUBLICATIONS

Kedzierski, Jakub et al., "Novel method for silicon quantum wire transistor fabrication", J. Vac. Sci. Technol. B17(6), Nov./Dec. 1999, pp. 3244-3247.

\* cited by examiner

*Primary Examiner* — N Drew Richards
*Assistant Examiner* — Kyoung Lee
(74) *Attorney, Agent, or Firm* — Harrington & Smith

(57) ABSTRACT

In one exemplary embodiment, a method for fabricating a nanowire product comprising: providing a wafer having a buried oxide (BOX) upper layer in which a well is formed, the wafer further having a nanowire having ends resting on the BOX layer such that the nanowire forms a beam spanning said well; and forming a mask coating on an upper surface of the BOX layer leaving an uncoated window over a center part of said beam over said well and also forming a mask coating around beam intermediate ends between each end of a beam center part and a side wall of said well. In another exemplary embodiment, a nanowire product comprising: a wafer having a buried oxide (BOX) upper layer in which a well having side walls is formed; a nanowire having ends resting on the BOX layer so as to form a beam spanning said well and said side walls; and a hard mask coating on an upper surface of said BOX layer and around intermediate ends of said beam between each side wall of said well and ends of a center part of said beam leaving an uncoated window over a beam center part through which oxidation of said beam center part can take place.

20 Claims, 6 Drawing Sheets

ROBUST TOP-DOWN SILICON NANOWIRE STRUCTURE USING A CONFORMAL NITRIDE

FIELD OF THE INVENTION

The present invention relates to a method of increasing the reliability of a nanowire structure and a nanowire product having such increased reliability

BACKGROUND

Nanowires are attracting increasing interest due to their physical properties and use in various nano devices. In semiconductor devices nanowires are used as building blocks for the fabrication of photonics and electronic nano devices and in sensors in particular. Semiconductor devices also use nanowires for various purposes. These include to form connections, such as a transistor channel, between various electrodes of transistors found in microcircuits manufactured by a CMOS process. The nanowires can be of silicon which has the advantage of a fairly easy integration into existing silicon device technology together with the reproducible control of their electronic properties.

A top-down fabrication procedure is often used in the fabrication of devices that use silicon nanowires. The top-down fabrication procedure is similar to that used in the fabrication of CMOS devices. In this procedure there is a substrate, usually of silicon, having a buried silicon oxide (BOX) layer on its top surface on which a silicon nanowire is located. The silicon nanowire can be formed by chemical vapor deposition of Si onto the BOX layer or on SOI wafers or by other well-known techniques.

In one type of such a transistor device a nanowire spans a well, much like a beam. The well is an etched out area of the BOX layer into which a gate electrode of the transistor is to be formed. Various processing steps are carried out from the top of this type of nanowire product. One such step is the thinning of a part of the nanowire beam that spans the well for the purpose of forming an ultra-thin transistor channel. In this step the wire portion is thinned by oxidation. To accomplish the oxidation thinning of a selected part of the nanowire a hard mask is deposited over portions of the wire and BOX layer that are not to be etched away by oxidation. A hard mask is a suitable material that is not affected by oxidation, one such material being silicon nitride. The hard mask has an open portion, called a window, through which oxidation of the selected part of the nanowire can take place.

Problems are sometimes encountered with the process of selective oxidation that takes place through the hard mask window. The problems sometimes cause the silicon nanowire structure to break at the region where the nanowire beam under the mask is in contact with the BOX layer, that is, where an end of the nanowire beam is supported on its BOX layer. The diffusion of oxygen through the BOX layer during the oxidation process enhances the local oxidation at the ends of the beam supported on the BOX layer. This causes a thinning of the silicon nanowire in these regions thereby producing areas where the beam support is weakened. When the nanowire is scaled to smaller dimensions, such as below 20 nm, these regions may result in a break in the nanowire structure due to stress.

Accordingly, a need exists to improve the fabrication process in a manner so that the product, such as a transistor, that is produced with the nanowire does not have the nanowire breakage problem.

SUMMARY

In one exemplary embodiment of the invention, a method for fabricating a nanowire product comprising: providing a wafer having a buried oxide (BOX) upper layer in which a well is formed, the wafer further having a nanowire having ends resting on the BOX layer such that the nanowire forms a beam spanning said well; and forming a mask coating on an upper surface of the BOX layer leaving an uncoated window over a center part of said beam over said well and also forming a mask coating around beam intermediate ends between each end of a beam center part and a side wall of said well.

In another exemplary embodiment of the invention, a nanowire product comprising: a wafer having a buried oxide (BOX) upper layer in which a well having side walls is formed; a nanowire having ends resting on the BOX layer so as to form a beam spanning said well and said side walls; and a hard mask coating on an upper surface of said BOX layer and around intermediate ends of said beam between each side wall of said well and ends of a center part of said beam leaving an uncoated window over a beam center part through which oxidation of said beam center part can take place.

BRIEF DESCRIPTION OF THE DRAWINGS

Other objects and advantages of the present invention will become more apparent upon reference to the following specification and annexed drawings in which.

Each of FIGS. 1-11 is a cross-sectional view, showing a portion of a semiconductor nanowire product at various steps of the top down fabrication process.

DETAILED DESCRIPTION

Figure 1:
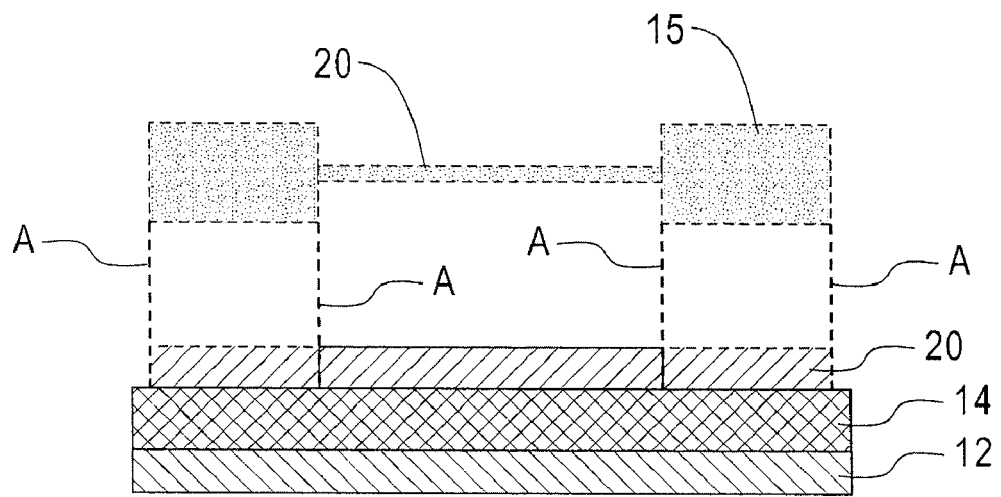

The fabrication process for the nanowire product is shown in FIGS. 1-8 in which the same reference numbers are used for the same elements throughout. Fabrication of a semiconductor device having a nanowire product, such as a transistor, by the top down process begins as shown in FIG. 1. In this figure the upper part is a top view of the lower part sighted along the vertical dotted lines A. FIG. 1 shows only one product, illustratively one transistor, of the device. The product is usually replicated many times on a substrate during the fabrication process.

There is a substrate such as a silicon wafer 12 of a suitable thickness. On top of the wafer 12 is a buried oxide (BOX) layer 14, which is a layer of silicon having an oxide in it. The BOX layer 14 also has a thickness depending upon the specific product being fabricated. A nanowire 20 of desired diameter, which is of silicon in the exemplary embodiment of the invention, is present on the upper surface of the BOX layer. The nanowire is defined by any conventional process such as lithography and reactive ion etching. The top view in the upper part of FIG. 1 with the rectangular areas 15 basically defines the product perimeter.

Figure 2:
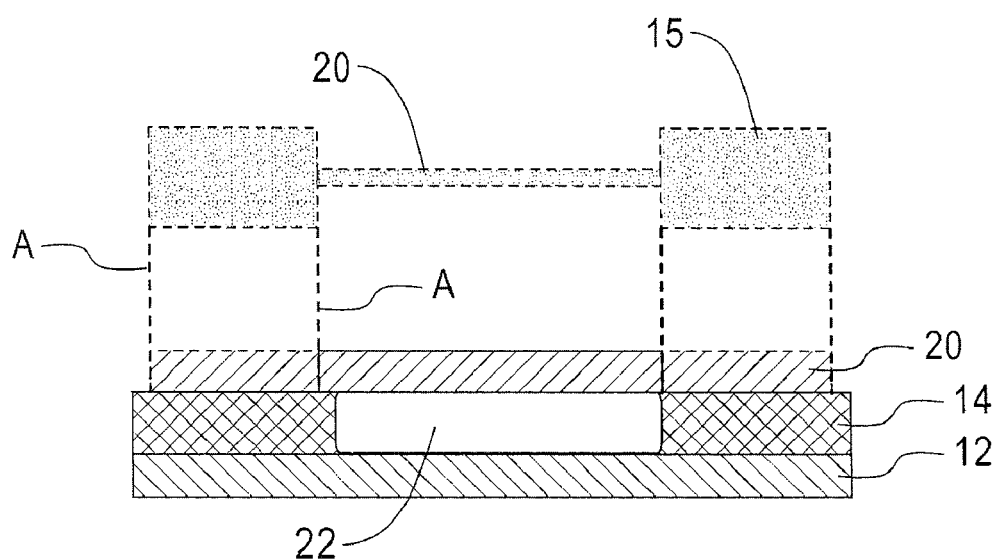

FIG. 2 shows a well 22 formed in the BOX layer 14 under the nanowire 20. The well 22 can be of any desired shape and usually is generally circular. The well 22 can be formed by wet or dry hydrogen fluoride vapor etching or any other suitable process. As seen, the nanowire 20 is released into a beam that spans the well 20 with an end of the nanowire being on each side of the well and supported on the BOX layer. If the product being made is a transistor, then a gate region is to be formed in the well 22 during a latter stage of the fabrication process.

Figure 3:
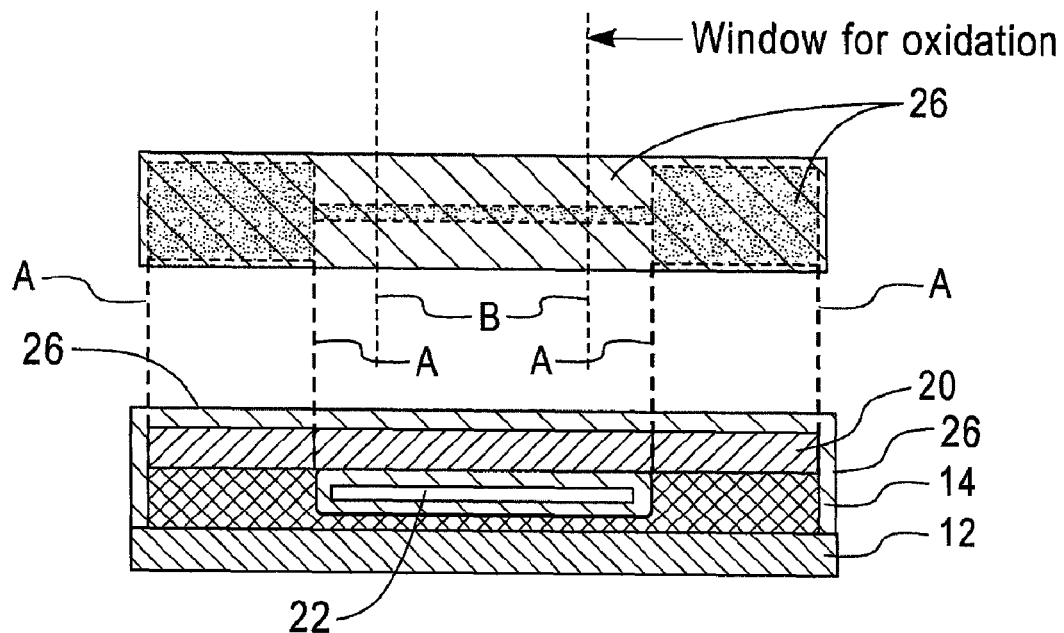

In FIG. 3 a hard mask 26 of a material resistant to oxidation, such as silicon nitride, is deposited by thermal growth or vapor deposition over the top and sides of the BOX layer 14, around the nanowire beam over the well 22 and over the well bottom and side walls. Other suitable materials for the hard mask are silicon carbide, silicon germanium, and polysilicon. The mask forms a conformal coating and is a good barrier to oxidation. Suitable processes for depositing the hard mask 26 are thermal oxidation, CVD (LPCVD, PECVD, RTCVD) and MLD.

Figure 4:
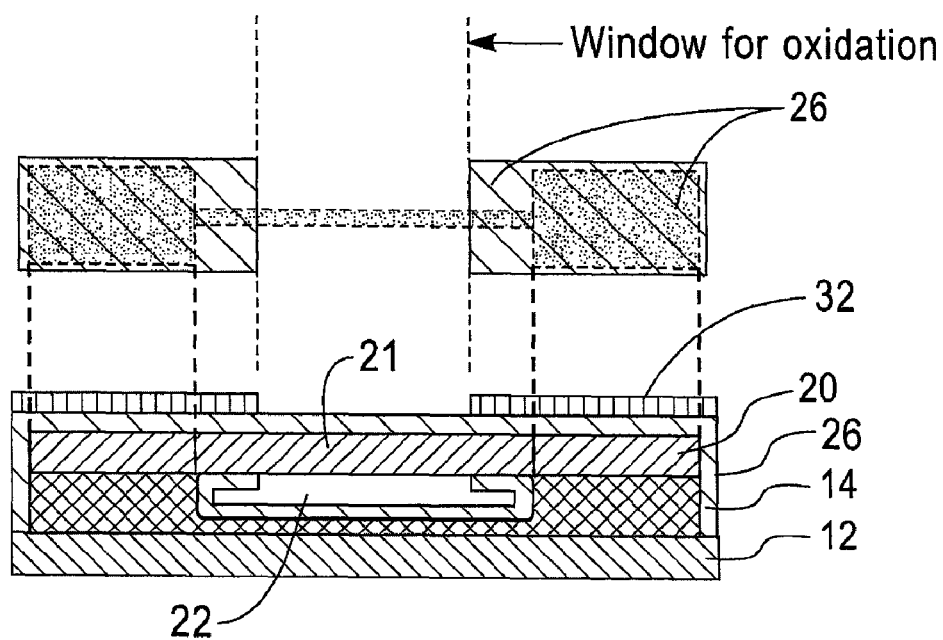

A part of the hard mask 26 is to be removed so that a window can be formed to permit oxidation of the center part of the silicon nanowire 20 beam that spans the well 22. To do this, as shown in FIG. 4, a layer of a resist material 32 such as any ultra-violet or electron beam sensitive material with a resolution suitable for the dimensions is placed on the mask 26 at each end of the nanowire and extending somewhat into the well 22 to define the center portion of the nanowire that is to be etched. The part of the mask 26 that is not covered by the resist material 32 can be removed. The vertical lines B-B define the center part 21 of the wire 20 which is the area having no resist material 32 and where the mask 26 is to be removed. The center part 21 of the nanowire between the resist material 32 masked ends is to be oxidized and thinned down.

Figure 5:
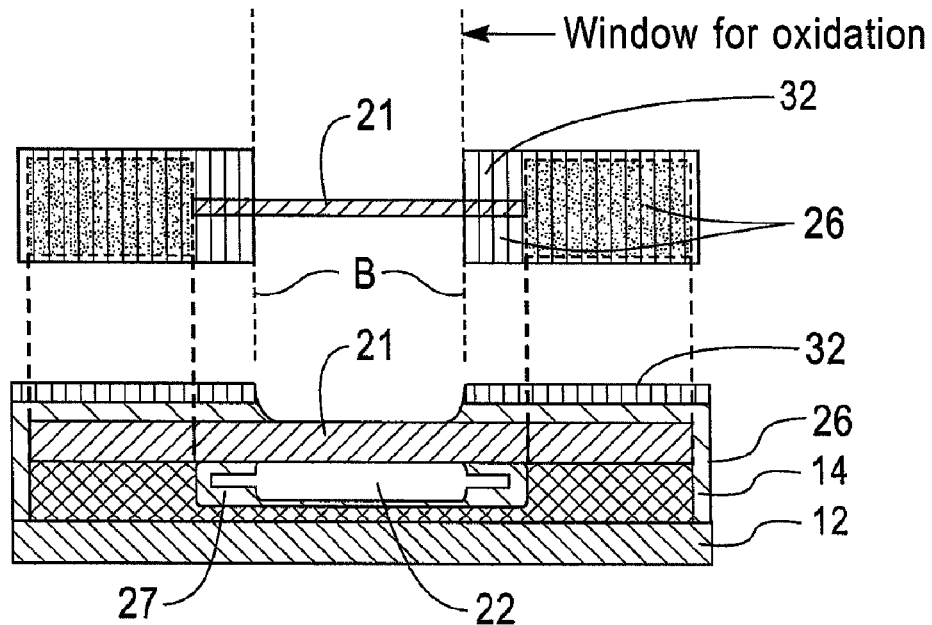

FIG. 5 shows the removal of the hard mask 26 above the center part 21 of nanowire where there is no resist mask 32. This forms a window for oxidation between the vertical lines B-B. The hard mask in the well 22 below the wire center part also has been removed but leaving a region 27 at the intermediate ends of the wire, that is, between the wire center part 21 and the well 22 side walls. The nitride mask 26 can be removed with either a chemical nitride etch, of which there are several, or reactive ion etching (RIE) or any other selective means that will not attack the material of the resist mask 32.

Figure 6:
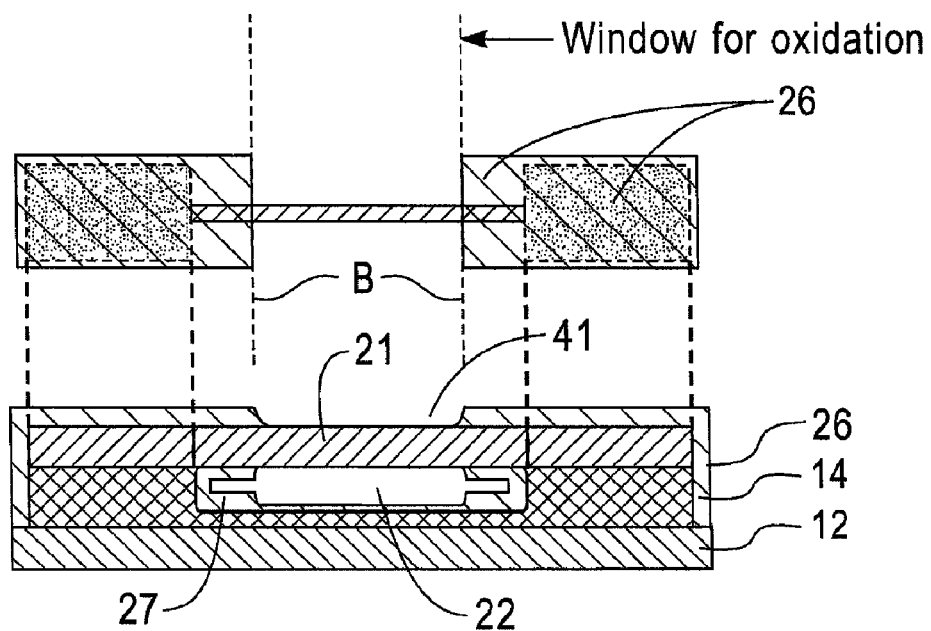

FIG. 6 shows the resist material removed from the top of the hard mask 26. Oxidation of the nanowire can now take place through the window 41 between the lines B-B.

Figure 7:
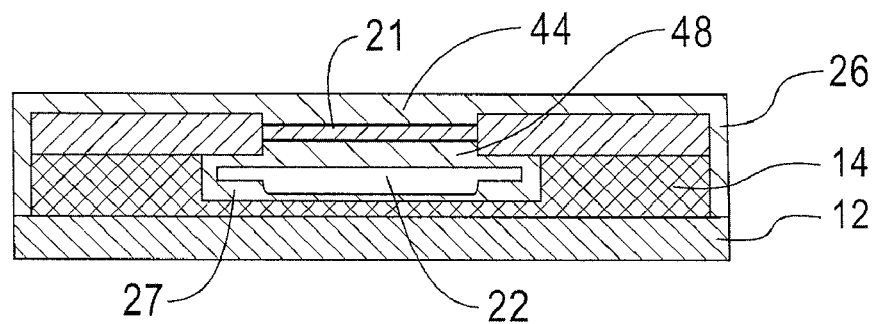

FIG. 7 shows the step of providing oxygen through the window 41. The oxygen flows around the beam center 21 that has no mask 26 including flowing into the well 22. The oxidation creates material 44 in the center part of the wire by oxidizing silicon to silicon oxide. That oxide is subsequently removed. As seen, the result is that the center part 21 of the wire between the hard mask 26 material is thinned. Basically, the diameter of the center part of the nanowire is reduced. The amount of thinning is controlled based on the parameters of the oxidation gas and the time of its application. The intermediate end parts 48 of the nanowire 20 between each end of the center part and the well side walls of the BOX layer 14 that are covered by the mask layer part 27 also are thinned but in a different manner and not as much.

Figure 8:
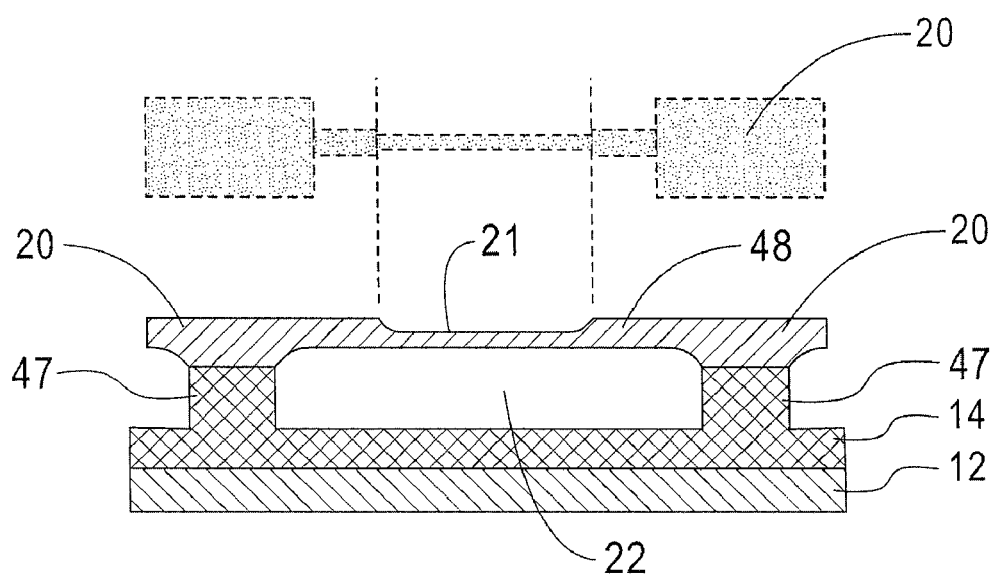

Referring now to FIG. 8 this shows the structure after the hard mask material 26 is removed, including the parts 27 around the wire intermediate ends over the well 22. The BOX layer forms a pad 47 for each end of the nanowire and a connection will be made to each end for the transistor source and drain. The intermediate end part 48 at each side of the nanowire center part that was coated by the hard mask 27 is not thinned as much as the center part 21. Therefore, the nanowire intermediate end parts 48 become thicker toward the BOX layer pad 47. This provides a transition from each end of the nanowire supported on the BOX layer to the thinned down center part of the wire. This improves the nanowire structural integrity. If the intermediate end of the nanowire is not coated in the region 27 with the hard mask material then it also would be thinned down like the wire center part 21 thereby making the beam weak and more subject to fracture. Also, if exposed to high-energy ion implantation, such as that used for making the gate and the source and drain electrodes of a transistor conductive, a thinned silicon beam may become amorphized and form a break in the electrical path of that transistor. The thinned out region will be protected by the gate that is later formed.

Figure 9:
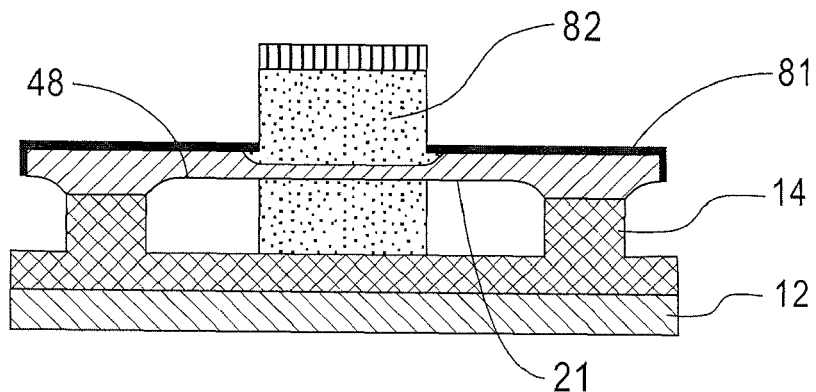
Figure 10:
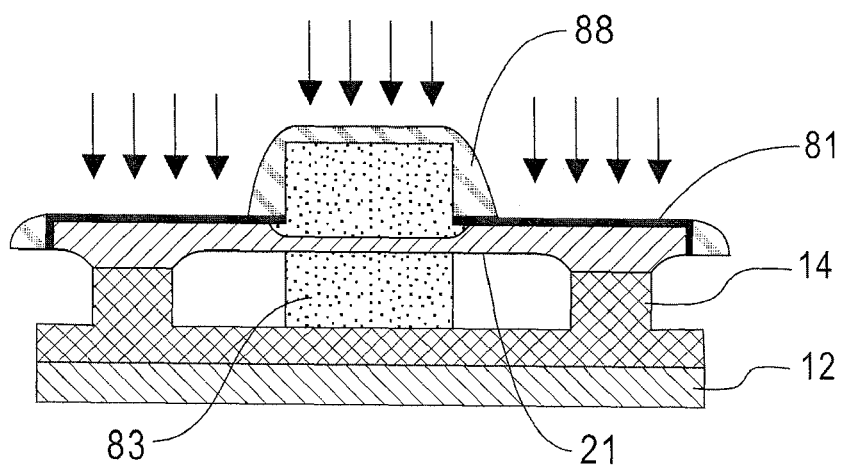
Figure 11:
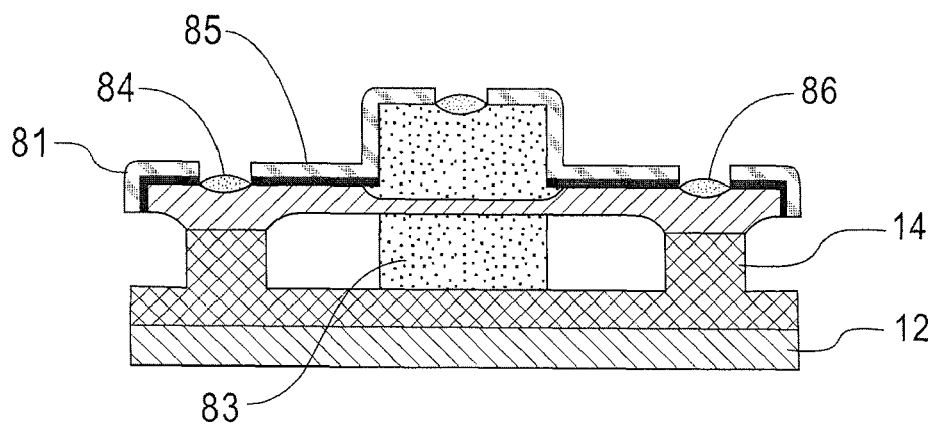

After the product has been processed to the form shown in FIG. 8, a gate is fanned at the bottom of the well 22 below the nanowire thinned center portion 44. This is shown in FIGS. 9-11. In FIG. 9 a layer 81 of a gate stack dielectric material such as but not limited to silicon dioxide, hafnium oxide, or some other material with a high dielectric constant (ratio of permittivity to permittivity in vacuum) is deposited on and around the nanowire and the outer surface of the BOX layer 14. In a preferred embodiment the gate dielectric is selected to have a dielectric constant k between about 3 and 50, and specific materials include silicon and oxygen (e.g., silicon dioxide) with or without nitrogen, and hafnium and oxygen (e.g., hafnium oxide) with at least one of lanthanum, aluminum or silicon. The mask layer 81 also is deposited on the bottom and side walls of the well 22.

Subsequently, the gate electrode material 82, such as, but not limited to polysilicon or a metal, can be deposited all around the nanowire such as by any conventional vapor deposition process. FIG. 10 shows the gate 83 after patterning such as by RIE (reactive ion etching) via a hardmask (e.g., a CVD oxide on top of the gate material and under the resist). The reactive ion etch stops on the wire which has a gate dielectric on it (from prior to the gate deposition), and is selective to those materials. This can be considered vertically etching the gate material, from a direction opposite the well. Then an anisotropic etch is performed to etch away, sideways, the material under the wire where the gate was already etched earlier from the top-down. This can be considered as laterally etching the gate material that is deposited within the well. This lateral clearing away prevents the capacitive or shorting issues from the gate to the transistor source and drain. The end result is a gate-all-around structure which is superior in electrostatic control over the channel in either single gate, double gate, and even FinFET embodiments. This step can be followed by a formation of a spacer 88 such as of silicon nitride and a subsequent ion implantation, as shown in FIG. 10. FIG. 11 shows the finished device in which metal electrodes and contacts can be formed in the areas 84 and 86 to provide access to the source and drain of the transistor at the ends of the nanowire. It also is possible to place the gate in the well prior to the thinning of the wire.

Figure 12:
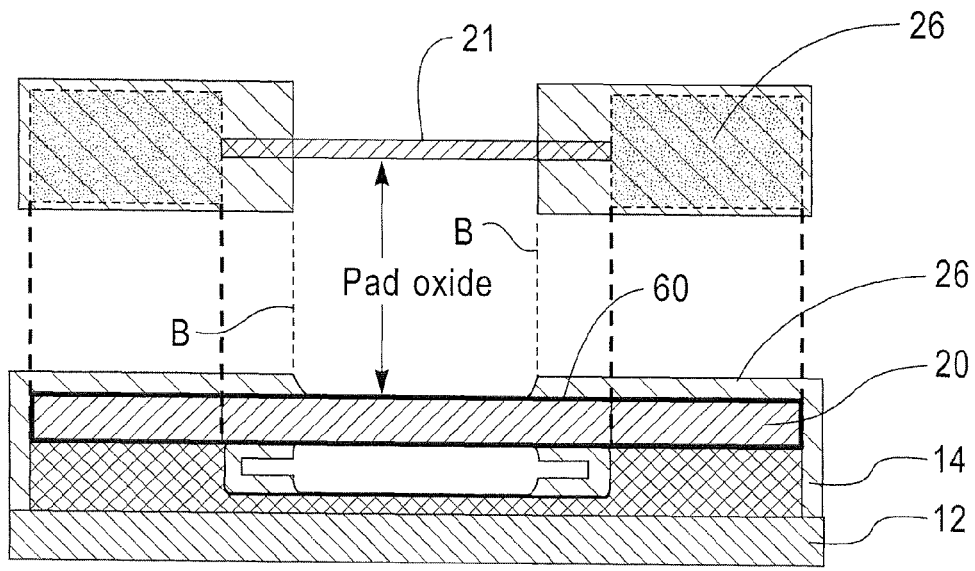
FIG. 12 is a cross section of a further embodiment in which a thermal oxide coats the nanowire before it is oxidized.

FIG. 12 shows a further embodiment of the invention. Here, a layer 60 of an oxide, one that is thermally grown, is placed over the nanowire 20. The layer 60 can be of silicon dioxide. This preferably would be done after FIG. 2 of the process sequence described above. The silicon dioxide also is shown at the ends of the nanowire where they rest on the BOX layer 14. The oxide is not grown on the underside of the wire end regions but is shown in the drawing because silicon dioxide is present in the BOX layer. The presence of the silicon dioxide layer 60 is used when needed to balance out the thin film stress due to the oxidation mask such as nitride. This stress can change the oxidation rate and can compromise structural stability further. The layer 26 of the hard mask material is shown over the oxide layer 60.

Figure 13:
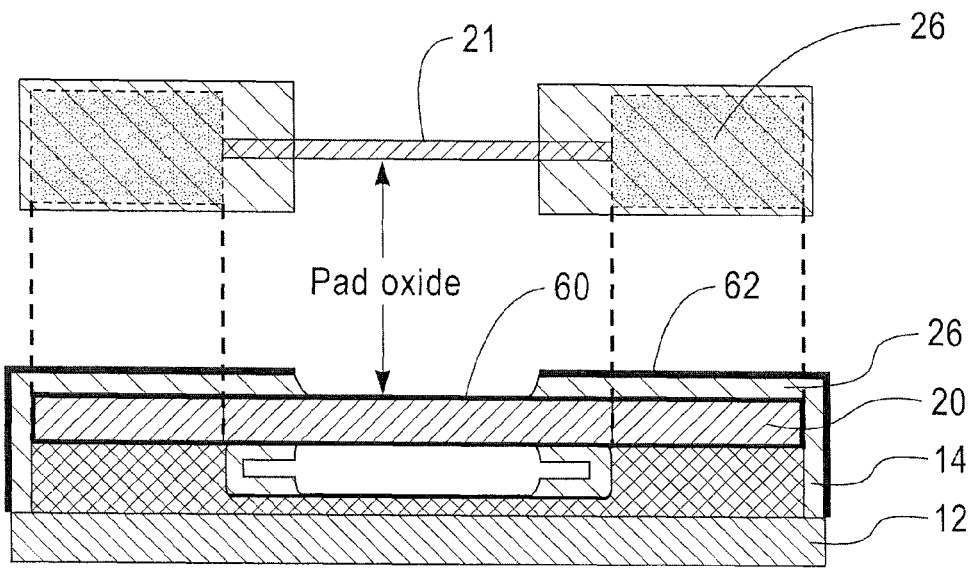
FIG. 13 is a cross section of the product in which the thermal oxide also coats the upper surface of the hard mask.

FIG. 13 shows yet another embodiment that modifies FIG. 12 in that a silicon dioxide layer 62 also has been grown over the mask 26 in addition to over the nanowire 20. This would be done in two stages with the layer 60 being grown over the wire 20 after the fabrication stage shown in FIG. 2 described above and the oxide layer 62 grown over the hard mask 26 after FIG. 5 of the process sequence described above. The oxide 62 over the mask layer 26 is to be used as a mask for patterning the oxidation mask (such as nitride). In that embodiment, the resist layer in FIG. 4. is used to pattern this top oxide layer, which in turn is used to pattern the nitride layer.

It is also possible to have only a stack of only an oxide over the hard mask (nitride). That is, the underside of the nanowire would not have an oxide coating.

In accordance with the above teachings there is a method for fabricating a nanowire product comprising: providing a wafer having a buried oxide (BOX) upper layer in which a well is formed and a nanowire having ends resting on the BOX layer that faun a beam spanning said well; and forming a mask coating on the upper surface of the BOX layer leaving an uncoated window over a center part of said beam over said well and also forming a mask coating around the beam intermediate ends between each end of said beam center part and a side wall of said well.

The above method may further include one or more of the following: providing oxygen through the window onto the wire and into the well for thinning the beam center part; each beam intermediate end is thinned less than the beam center part; and the beam intermediate ends within the well have a generally thicker shape than the beam center part. In various embodiments the nanowire is of silicon; and/or the mask is selected from the group consisting of silicon nitride, silicon carbide, silicon germanium, and polysilicon. In further embodiments the above method may also include one or more of the following: forming a gate electrode at the bottom of the well; providing an electrical contact area at each end of the nanowire for a source and a drain; providing an electrical contact area at each end of the wire for a source and a drain; forming a gate electrode after the beam center part is thinned; placing a layer of an oxide around said wire before said mask is formed; and/or placing a layer of an oxide around the wire before the mask is formed and placing a layer of an oxide over the masked after it is formed.

In accordance with the above teachings there is a nanowire product which comprises a wafer having a buried oxide (BOX) upper layer in which a well having side walls is formed; a nanowire having ends resting on the BOX layer that forms a beam spanning the well and the side walls; and a hard mask coating on the upper surface of the BOX layer and around intermediate ends of the beam between each side wall of the well and the ends of a center part of the beam leaving an uncoated window over the beam center part through which oxidation of the beam center part can take place.

The above nanowire product may further be characterized by one or more of the following:
  the hard mask is removed after oxidation leaving each the beam intermediate end thinned less than the beam center part;
  there is a gate electrode on the bottom wall of the well;
  there is further a transistor source at one end of the nanowire resting on the BOX layer and a transistor drain at the other end of the nanowire;
  the hard mask is removed after oxidation leaving the beam intermediate ends within the well with a generally thicker shape than the beam center part;
  the nanowire is made of silicon; the hard mask is made of silicon nitride;
  there is a layer of an oxide around the wire under the mask; and/or
  there is further a layer of an oxide around the wire under the hard mask and a layer of an oxide over the hard mask.

In accordance with another embodiment of the above teachings there is a method for making a semiconductor device comprising: growing or depositing a layer of gate dielectric material about a wire that is suspended over a well; depositing a gate electrode material on and around the layer of gate dielectric material and the wire; vertically etching a portion of the deposited gate material from a direction opposite the well; and laterally etching a portion of the gate material that was deposited within the well.

The above another method may further include one or more of the following:
  the gate material is laterally etched to match the gate material remaining at the direction opposite the well after the vertical etching;
  the device comprises a transistor in which the wire spans a source and a drain;
  the lateral etch is to an extent to prevent shorting of the wire to the source and to the drain via the gate material;
  the wire comprises a thinner portion that is suspended over the well and a thicker portion that contacts the source and the drain;
  the gate dielectric material is selected to have a dielectric constant k between 3 and 50;
  the gate electrode material is conformal and comprises at least one of polysilicon and metal;
  the gate electrode material is deposited via at least one of chemical vapor deposition or atomic layer deposition;
  the gate electrode material is vertically etched via a lithographic pattern and hardmask;
  depositing the gate electrode material on and around the layer of gate dielectric material and the wire comprises depositing gate material in the well, and after forming the wire with the layer of gate dielectric material then depositing gate electrode material on the layer of gate dielectric material and wire that lies above the well in which gate material is already deposited; and
  depositing the gate electrode material on and around the layer of gate dielectric material is performed in a single deposition process step.

In accordance with another embodiment of the above teachings there is a computer readable memory storing a program of computer readable instructions that when executed by a processor result in actions directed to forming a semiconductor device. In this embodiment of the invention, the actions are set forth above for either of the methods.

Specific features of embodiments of the invention are shown in one or more of the drawings for convenience only, as each feature may be combined with other features in accordance with the various embodiments of the invention. Alternative embodiments will be recognized by those skilled in the art and are intended to be included within the scope of the claims. Accordingly, the above description should be construed as illustrating and not limiting the scope of the invention. All such obvious changes and modifications are within the patented scope of the appended claims.

We claim:

1. A method for fabricating a nanowire product comprising:
  providing a wafer having a buried oxide (BOX) upper layer in which a well is formed, the wafer further having a nanowire having ends resting on the BOX layer such that the nanowire forms a beam spanning said well; and forming a mask coating on an upper surface of the BOX layer leaving an uncoated window over a center part of said beam over said well and also forming a mask coating around beam intermediate ends between each end of a beam center part and a side wall of said well.

2. The method as claimed in claim 1, further comprising: providing oxygen through said window onto said nanowire and into said well for thinning said beam center part.

3. The method as claimed in claim 2, wherein each one of said beam intermediate ends is thinned less than said beam center part.

4. The method as claimed in claim 3, wherein said beam intermediate ends within said well have a generally thicker shape than said beam center part.

5. The method as claimed in claim 1, wherein said nanowire comprises silicon.

6. The method as claimed in claim 5, wherein said mask is selected from a group consisting of silicon nitride, silicon carbide, silicon germanium, and polysilicon.

7. The method as claimed in claim 1, further comprising: forming a gate electrode at a bottom of said well.

8. The method as claimed in claim 7, further comprising: providing an electrical contact area at each end of said nanowire for a source and a drain.

9. The method as claimed in claim 8, wherein a formed gate surrounds the beam center part over said well.

10. The method as claimed in claim 7, wherein forming the gate electrode is performed after thinning said beam center part.

11. The method as claimed in claim 1, further comprising: placing a layer of oxide around said nanowire before forming said mask coating.

12. The method as claimed in claim 1, further comprising: placing a first layer of oxide around said nanowire before forming said mask coating and placing a second layer of oxide over said mask coating after it is formed.

13. A nanowire product comprising:
a wafer having a buried oxide (BOX) upper layer in which a well having side walls is formed;
a nanowire having ends resting on the BOX layer so as to form a beam spanning said well and said side walls; and
a hard mask coating on an upper surface of said BOX layer and around intermediate ends of said beam between each side wall of said well and ends of a center part of said beam leaving an uncoated window over a beam center part through which oxidation of said beam center part can take place.

14. The nanowire product as claimed in claim 13, wherein said hard mask is removed after oxidation leaving each one of said beam intermediate ends thinned less than said beam center part.

15. The nanowire product as claimed in claim 14, further comprising a gate electrode on a bottom wall of said well.

16. The nanowire product as claimed in claim 15, further comprising a transistor source at one end of said nanowire resting on said BOX layer and a transistor drain at the other end of said nanowire.

17. The nanowire product as claimed in claim 14, in which said beam intermediate ends within said well exhibit a generally thicker shape than said beam center part.

18. The nanowire product as claimed in claim 14, wherein said nanowire comprises silicon and said hard mask comprises silicon nitride.

19. The nanowire product as claimed in claim 13, further comprising a layer of oxide around said nanowire and under said hard mask.

20. The nanowire product as claimed in claim 13, further comprising a first layer of oxide around said nanowire and under said hard mask and a second layer of oxide over said hard mask.

* * * * *